United States Patent [19]

Sugio et al.

[11] Patent Number: 4,496,695
[45] Date of Patent: Jan. 29, 1985

[54] CURABLE RESIN COMPOSITION

[75] Inventors: Akitoshi Sugio, Saitama; Masanobu Masu, Tokyo; Masatugu Matunaga, Tonemachi, Japan

[73] Assignee: Mitsubishi Gas Chemical Company, Inc., Tokyo, Japan

[21] Appl. No.: 352,029

[22] Filed: Feb. 24, 1982

[30] Foreign Application Priority Data

Feb. 28, 1981 [JP] Japan ................... 56-28972

[51] Int. Cl.$^3$ ............... C08F 283/08; C08L 71/04; C08L 63/00
[52] U.S. Cl. .................... 525/391; 525/395; 525/396
[58] Field of Search ............ 525/396, 391, 395

[56] References Cited

U.S. PATENT DOCUMENTS 4,315,086  2/1982  Ueno et al. ................ 525/391

Primary Examiner—John C. Bleutge
Assistant Examiner—Robert E. L. Sellers, II
Attorney, Agent, or Firm—Browdy and Neimark

[57] ABSTRACT

A curable resin composition comprising:
(a) a polyphenylene ether resin,
(b) a maleimide component and/or a cyanate ester component, and
(c) an epoxy compound is disclosed. The cured resin composition can give a cured resin having resistance to heat, solvent and moisture, adhering property and electrical properties.

11 Claims, No Drawings

CURABLE RESIN COMPOSITION

BACKGROUND OF THE INVENTION

This invention relates to a curable resin composition from which a cured resin having resistance to heat, solvent and moisture, adhering property and electrical properties can be prepared.

With the recent advance in electrical and electronics appliances for communication, household and industry, there has been an increasing demand for simplifying methods of mounting such appliances, and accordingly it has been desired to develop electronics materials of light weight and high performance. Various investigations have been undertaken in the field of polymeric materials in order to meet this demand.

In particular, since circuits of higher density have recently been achieved in printed circuit boards, it has been desired to use materials having between heat resistance, dimensional stability or electrical properties. Usually, copper-clad laminated boards based on thermosetting resins such as phenolic resins or epoxy resins are used as the printed circuit boards. The thermosetting resins previously used, however, generally have the defect of poor electrical properties, especially in the high frequency range.

On the other hand, many thermoplastic resins have excellent electrical properties, and attempts have been made to apply heat-resistant thermoplastic resins to electronics instruments and appliances. However, thermoplastic resins are generally inferior to thermosetting resins in heat resistance, solvent resistance, dimensional stability, etc., and their mechanical properties depend largely on temperature. This generally limits the uses of thermoplastic resins.

Polyphenylene ether resins are thermoplastic resins having excellent mechanical and electrical properties, and they exhibit high heat resistance for thermoplastic resins. An attempt was made to produce a copper-clad material having a polyphenylene ether resin as a substrate by utilizing these properties (Japanese patent publication (Kohkoku) No. 25394/1976). When this copper-clad material is exposed to high temperatures, however, the resin is degraded and its impact strength or toughness is reduced rapidly. Moreover, with increasing temperature, its mechanical strength is reduced, and the material undergoes deformation. Furthermore, with increasing temperature, the adhesion strength of the copper foil decreases to cause undesirable phenomena such as swelling or peeling. Because of these defects, copper-clad materials based on polyphenylene ether resins have not yet gained commercial acceptance.

Polyphenylene ether resins are also widely used in fields which involve contact with city, agricultural and industrial waters by utilizing their strong resistance to acids, alkalies or hot water. But they have very poor resistance to aromatic hydrocarbons and halogenated hydrocarbons. Some methods have therefore been proposed to increase resistance to organic solvents. They include, for example, a method comprising curing a polyphenylene ether resin using a metal alcoholate as a catalyst (Japanese patent publication (Kohkoku) No. 29752/1969); a method comprising adding a crosslinking agent to a polyphenylene ether resin to form a three-dimensional network structure (U.S. Pat. No. 3,396,146); and a method comprising mixing a polyphenylene ether resin with a thermosetting resin, and curing the mixture (Japanese patent publication No. 15519/1975). According to these methods, the catalyst, the crosslinking agent or the thermosetting resin is decomposed at high temperatures (required for molding) which are near the melting point of the polyphenylene ether resin. This results in molded articles which are discolored or degenerated or contain foams. Accordingly, these methods have not yet been accepted commercially.

A method for producing a thermoplastic resin plate which comprises utilizing thermoplastic properties of polyphenylene ether resin without incorporating a thermosetting resin into polyphenylene ether resin has been proposed (Japanese patent publication (Kohkai) No. 156076/1979). However, when soldering is carried out on the thermoplastic resin plate at an elevated temperature, the adhesion strength of the copper foil decreases. Furthermore, when the plate is boiled and then is heated, the plate is blistered and deformed, thereby causing undesirable phenomena, such as peeling of the copper foil.

SUMMARY OF THE INVENTION

The present inventors carried out research for obtaining a curable resin composition capable of being used in electronics and having high performance. As a result, it was found that when a polyfunctional cyanate ester compound and/or a polyfunctional maleimide compound and an epoxy compound are added to a polyphenylene ether resin for modifying the resin, a curable resin composition not having the above mentioned shortcomings can be obtained. This invention is based on this discovery.

It is an object of this invention to provide a curable resin composition capable of giving a cured resin having much higher solvent resistance than the polyphenylene ether resin while substantially retaining the inherent properties, especially electrical properties, of the polyphenylene ether even if these electrical properties are not improved.

Another object of this invention is to provide a curable resin composition capable of giving a cured resin having such electrical properties and solvent resistance and exhibiting excellent adhesiveness to a foil of a metal such as copper.

This invention relates to a curable resin composition comprising:
- (a) a polyphenylene ether resin [sometimes hereinunder referred to as component (a)]
- (b) at least one compound selected from the group consisting of:
    - (1) a polyfunctional cyanate ester monomer,
    - (2) a prepolymer of (1),
    - (3) a coprepolymer of (1) and an amine,
    - (4) a polyfunctional maleimide,
    - (5) a prepolymer of (4),
    - (6) a coprepolymer of (4) and an amine, and
    - (7) a coprepolymer of (1) and (4) [sometimes hereinunder referred to as component (b)]
- (c) an epoxy compound [sometimes hereinunder referred to as components (c)];

said composition including a mixture of components (a), (b) and (c), a preliminary reaction product of components (a), (b) and (c), the combination of said mixture and said preliminary reaction product, the combination of (a) and the preliminary reaction product of (b) and (c).

DETAILED DESCRIPTION OF THE INVENTION

The curable resin composition of this invention can be cured by well known methods. The cured resin obtained by curing the composition is not a mere mixture of a polyphenylene ether resin, a polyfunctional cyanate ester compound and/or a polyfunctional maleimide compound, and an epoxy compound, but is one in which the components are crosslinked with one another. This is proved by the following fact:

To a polyphenylene ether resin were added 5 wt% of a polyfunctional maledimide compound and 5 wt% of an epoxy compound. The resulting composition was compression-molded at 240° C. for one hour to obtain a test sample. Extraction test of the test sample was carried out in chloroform for 18 hours by using a Soxhlet's extractor. Extraction residues of the test sample in chloroform was 36 wt% on the basis of weight of the test sample before testing. The amount of the residue decreased, according as the amount of a polyfunctional maleimide added increased. For example, when a cured resin obtained by curing a composition containing 50 wt% of a polyphenylene ether resin, 45 wt% of a polyfunctional maleimide compound and 5 wt% of an epoxy compound was subjected to extraction test by using chloroform, hardly any materials were extracted from the sample. On the other hand, when a polyphenylene ether resin was subjected to extraction test under the conditions mentioned above (at 240° C., for one hour and in chloroform), the extraction residue of the resin, that is material not extracted, was less than 1 wt%.

A composition containing 50 wt% of a polyphenylene resin, 15.5 wt% of a polyfunctional maleimide compound, 27 wt% of a polyfunctional cyanate ester compound and 7.5 wt% of an epoxy compound was compression-molded at 235° C. for one hour to obtain a test sample. When the test sample was subjected to extraction test under the conditions mentioned above, the extracted material was as low as 1%.

It was beyond expection that a cured resin obtained from a curable resin composition of this invention would show such excellent solvent resistance. In view of the fact that the polyphenylene ether resin has relatively low reactivity, one can hardly imagine that the polyphenylene ether resin would participate in the curing reaction. If the polyphenylene ether resin is in fact not involved in the curing reaction, it is difficult to explain why the solvent extraction of the resin composition of the invention is decreased to such an extent. We presume that the curing reaction of the composition of the invention is a reaction of forming a crosslinked network structure, in which the polyfunctional maleimide or the polyfunctional cyanate ester participates. The details of the reaction mechanism, however, have not been elucidated.

As mentioned above, a cured product having improved heat resistance can be obtained from a curable resin composition of this invention. For example, a cured product obtained from a curable resin composition of this invention has a glass transition temperature 20°–100° C. higher than that of a polyphenylene resin.

The cured product has excellent adhesion to copper foil and particularly shows adhesion to copper foil of 0.9–2.2 Kg/cm.

The cured product has excellent electrical properties. In particular, it shows a dielectric constant of less than 4.2 and dielectric dissipation factor of less than 0.01 which hardly depend on frequency and temperature.

The cured product has excellent moisture resistance. For example, a copper-clad laminate plate was prepared from a curable resin composition comprising 62 wt% of polyphenylene ether resin, 4 wt% of a polyfunctional maleimide compound, 33 wt% of a polyfunctional cyanate ester compound and 1 wt% of an epoxy compound. The resulting laminate plate was boiled for 8 hours. The plate had excellent moisture-resistance and thermal shock resistance at 260° C. for a period of more than 30 seconds.

The curable resin composition of this invention has excellent workability. For example, polyphenylene ether resin can be molded only when it is kept at high temperature under pressure. The curable resin composition of this invention can be molded at a temperature lower than molding temperature of polyphenylene ether resin alone. The curable resin composition can be heated or cooled within a shorter time than polyphenylene resin, so use of the curable resin composition can increase operating efficiency.

The polyphenylene ether resin used in this invention may be any of the known polyphenylene ether resins, for example, polymers obtained by polycondensing monocyclic phenols of the general formula

(i)

wherein $R_3$ and $R_4$ are identical or different and represent an alkyl group having 1 to 3 carbon atoms, and $R_5$ represent a hydrogen atom or an alkyl group having 1 to 3 carbon atoms.

Methods of polycondensation are well known per se. These polymers have in the polymer chain skeleton recurring units of the following formula

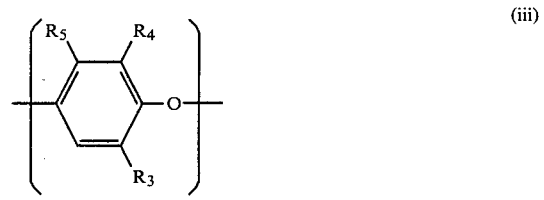

(iii)

wherein $R_3$, $R_4$ and $R_5$ are as defined above.

The alkyl group having 1 to 3 carbon atoms represented by $R_3$, $R_4$ and $R_5$ in formula (i) and (iii) are specifically methyl, ethyl, n-propyl and iso-propyl group, the methyl group being preferred.

The polyphenylene ether resins used in this invention may be homopolymers and copolymers. Examples include homopolymers typified by poly(2,6-dimethyl-1,4-phenylene)ether, poly(2-methyl-6-ethyl-1,4-phenylene)ether and and copolymers typified by a copolymer derived from 2,6-dimethylphenol and 2,3,6-trimethylphenol or a copolymer derived from 2-methyl-6-ethylphenol and 2,3,6-trimethylphenol. Among these, poly(2,6-dimethyl-1,4-phenylene)ether and the 2,6-dimethylphenol/2,3,6-trimethylphenol copolymer are especially useful as practical polyphenylene ether resins. Desirably, these polyphenylene ether resins have a number average molecular weight of about 1,000 to about 30,000. Polyphenylene ether resins having a relatively low molecular weight have good solubility and lend themselves to good handling, and on the other hand, polyphenylene ether resins having a relatively high molecular weight improve the mechanical properties of the resin composition. Thus, depending upon these properties, the polyphenylene ether resin is properly selected to suit a particular use.

Polyfunctional maleimide compounds employed as one of the components constituting a curable resin composition of this invention have at least 2 maleimide groups in the molecule and are represented by the following general formula

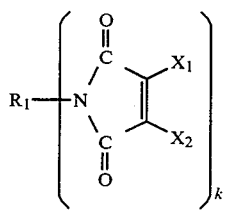
(ii)

wherein $R_1$ represents an aromatic or aliphatic organic group having a valence of k, $X_1$ and $X_2$ are the same or different and are independently a hydrogen atom, halogen atom or lower alkyl group and k is an integer of at least 2 and preferably an integer of 2–10. Oligomers or prepolymers derived from the above maleimide compounds may be used as the maleimide compound. Polyvalent, aromatic or aliphatic organic groups represented by $R_1$ in formula (II) include the following:

(i) aliphatic or alicyclic hydrocarbon groups having 4–16 carbon atoms,
(ii) polyvalent groups derived from aromatic hydrocarbons having benzene or naphthalene ring, such as benzene, xylene or naphthalene,
(iii) polyvalent groups derived from compounds in which at least 2 benzene rings are directly bonded, such as biphenyl,
(iv) aromatic ring-containing groups resulting from bonding of a plurality of benzene rings either directly or through a bridging member, represented by the formula

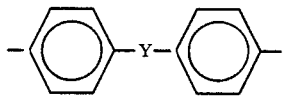

wherein Y represents a linear, branched or cyclic aliphatic hydrocarbon group having 1 to 14 carbon atoms, aromatic hydrocarbon group, such as a phenylene group, a xylylene group, an oxygen atom, a sulfur atom, a carbonyl group, a sulfonyl group, a sulfinyl group, an alkyleneoxyalkylene group a phosphonyl group, a phosphinyl group or an imino group, (v) melamine residues, and
(vi) residues of polynuclear product of benzene obtained by reacting aniline with formaldehyde, generally residues of polynuclear product having 2–10 benzene rings.

The maleimides represented by the above formula can be produced by a method known per se which involves reacting maleic anhydride with divalent or more polyamine having at least 2 amino groups to form a maleamide acid, and then dehydro-cyclizing the maleamide acid. The maleimide can be produced by known methods per se.

Aromatic amines are preferable as the starting polyamines, because the resulting object resin has excellent properties, such as heat-resistance, etc. However, if it is desired that the resulting object resins have only flexibility and pliability, alicyclic amine alone or combination of the alicyclic amines and other amines may be used. Though secondary amines can be used as the starting amine, the primary amines are preferable. Examples of the amines include meta- or para-phenylenediamine, meta- or para-xylylenediamine, 1,4- or 1,3-cyclohexanediamine, hexahydroxylylenediamine, 4,4'-diaminobiphenyl, bis(4-aminophenyl)methane, bis(4-aminophenyl)ether, bis(4-aminophenyl)sulfone, bis(4-amino-3-methylphenyl)methane, bis(3-chloro-4-aminophenyl)methane, bis(4-amino-3,5-dimethylphenyl)methane, bis(4-aminophenyl)cyclohexane, 2,2-bis(4-aminophenyl)propane, 2,2-bis(4-amino-3-methylphenyl)propane, 2,2-bis(3,5-dibromo-4-aminophenyl)propane, bis(4-aminophenyl)phenylmethane, 3,4-diaminophenyl-4'-aminophenylmethane and 1,1-bis(4-aminophenyl)-1-phenylethane, melamines having an s-triazine ring, and addition product of formalin and an aniline in which two or more benzene rings bond through methylene group.

Examples of polyfunctional maleimide include 1,3- or 1,4-dimaleimide benzene, 1,3- or 1,4-bis(maleimido methylene)benzene, 1,3- or 1,4-dimaleimido cyclohexane, 1,3- or 1,4-bis(maleimidomethylene)cyclohexane, 4,4-dimaleimido biphenyl, bis(4-maleimidophenyl)methane, bis-(4-maleimidophenyl)ether, bis(4-maleimidophenyl)sulfone, bis(4-maleimido-3-methylphenyl)methane, bis(4-maleimido-3-chlorophenyl)methane, bis(4-maleimido-3,5-dimethylphenyl)methane, 2,2-bis(4-maleimido-3-methylphenyl)propane, 2,2-bis(4-maleimido-3,5-dibromophenyl)propane, bis(4-maleimidophenyl)phenylmethane, 3,4-dimaleimidophenyl-4'-maleimidophenylmethane, 1,1-bis(4-maleimidophenyl)-1-phenyl-methane, maleimide derived from melamine and maleimide derived from addition product of formalin and an aniline in which two or more benzene rings bond through methylene group.

The polyfunctional maleimides as mentioned above may be used alone or as a mixture. Also the prepolymer of the maleimide obtained by heating the maleimide in the presence or absence of a catalyst may be used. In addition, coprepolymers of the maleimide and the amine employed for synthesizing the polyfunctional maleimide may be used. The prepolymerization and coprepolymerization should not be carried out to such an extent that gelation of the components occurs.

By "polyfunctional maleimide component" in the specification and the claims is meant at least one compound selected from the group consisting of
(i) a polyfunctional maleimide,
(ii) a prepolymer of (i) and
(iii) a coprepolymer of (i) and an amine.

By polyfunctional cyanate ester is meant a compound having at least two cyanate groups in its molecule. The polyfunctional cyanate ester is represented by the formula $$R_2\!-\!\!(\!O\!-\!C\!\equiv\!N)_m \quad \text{(iv)}$$

wherein $R_2$ is an aromatic nucleus-containing residue having 1–10 benzene rings selected from the group consisting of a residue derived from an aromatic hydrocarbon selected from the group consisting of benzene, biphenyl and naphthalene, a residue derived from a compound in which at least two benzene rings are bonded to each other by a bridging member selected from the group consisting of

wherein $R_6$ and $R_7$ are the same or different and each represents a hydrogen atom or an alkyl group containing 1 to 4 carbon atoms,

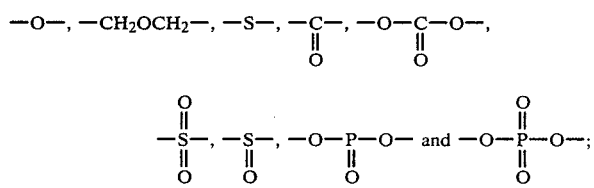

said aromatic nucleus is optionally substituted by a substituent selected from the group consisting of alkyl groups containing 1 to 4 carbon atoms, alkoxy groups, containing 1 to 4 carbon atoms, chlorine and bromine; m is an integer of at least 2 and preferably 2–10, and the cyanate group is always directly bonded to the aromatic nucleus.

$R_2$ in formula (IV) includes the following:
(i) polyvalent groups derived from aromatic hydrocarbons having benzene or naphthalene ring, such as benzene, xylene or naphthalene,
(ii) polyvalent groups derived from compounds in which at least 2 benzene rings are directly bonded, such as biphenyl,
(iii) aromatic ring-containing groups resulting from bonding of a plurality of benzene rings either directly or through a bridging member, represented by the formula

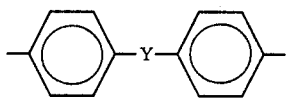

wherein Y represents a linear, branched or cyclic aliphatic hydrocarbon group having 1 to 14 carbon atoms, aromatic hydrocarbon group, such as a phenylene group, a xylylene group, an oxygen atom, a sulfur atom, a carbonyl group, a sulfonyl group, a sulfinyl group, an alkyleneoxyalkylene group, a phosphonyl group, a phosphinyl group or an imino group,
(iv) residue of polynuclear product of benzene obtained by reacting phenol with formaldehyde, generally residues of polynuclear product having 2–10 benzene rings.

Polyfunctional cyanate esters represented by formula (iv) are prepared by well known methods, for example, by reacting the corresponding polyvalent phenol with a halogenated cyanate as exemplified in U.S. Pat. Nos. 3,553,244, 3,740,348 and 3,755,402.

Examples of the polyfunctional cyanate ester include 1,3- or 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane; 2,2-bis(4-cyanatophenyl)propane, 2,2-bis(3,5-dichloro-4-cyanatophenyl)propane, 2,2-bis(3,5-diblomo-4-cyanatophenyl)propane; bis(4-cyanatophenyl)ether; bis(4-cyanatophenyl)thioether; bis(4-cyanatophenyl)sulfone; tris(4-cyanatophenyl)phosphite; tris(4-cyanatophenyl)phosphate; bis(3-chloro-4-cyanatophenyl)methane; cyanated novolak derived from novolak, cyanated bisphenol type polycarbonate oligomer derived from bisphenol type polycarbonate oligomer, and mixture thereof, and polynuclear compounds of benzene obtained by reacting phenol resin and a halogenated cyanide (refer to U.S. Pat. No. 4,026,913 and U.S. Pat. No. 3,448,079). Other cyanate esters employed in the practice of this invention are given in U.S. Pat. Nos. 3,553,244; 3,740,348; 3,755,402; 3,562,214; British Pat. No. 1,060,933; Japanese patent publication (Kohkoku) Nos. 18468/1968; British Pat. Nos. 1,218,447 and 1,246,747 and U.S. Pat. No. 3,994,949 and Japanese Patent Publication (Kohkai) No. 26853/1972 which are incorporated herein for reference. Of these cyanate esters, divalent cyanate ester compounds which are derived from divalent phenols, have symmetric structure and do not have any condensed ring in their bridging portion, such, as for example, 2,2-bis(4-hydroxyphenyl)propane are preferable, because they are commercially available and give cured product having excellent properties. Polycyanate compounds obtained by reacting a phenol-formaldehyde precondensate with a halogenated cyanide are also satisfactory. The above mentioned cyanate esters may be used as mixtures.

Prepolymers may be used containing a sym-triazine ring which is prepared by the trimerization of the cyanate groups of the cyanate ester, and which have an number average molecular weight of at least 400 but no more than 6,000. Such prepolymers can be prepared by polymerizing the above cyanate esters in the presence or absence of catalysts, for example mineral acids or Lewis acids, a base such as sodium hydroxide, a sodium alcoholate or a tertiary amine, a salt such as sodium carbonate or lithium chloride, or phosphate esters, such as tributyl phosphine.

The polyfunctional cyanate ester can be used in the form of a mixture of the monomer and the prepolymer. For example, many of the commercially available cyanate esters derived from bisphenol A and cyanogen halide are in the form of mixtures of cyanate monomers and prepolymers, and such materials can also be used in the present invention.

A coprepolymer of the cyanate ester and an amine may be used as the cyanate ester component.

Amines employed for preparing coprepolymers of the maleimide and the amine can be used in reaction with the cyanate ester compound.

The the epoxy compounds in the claims and the specification are meant polymeric compounds having one or more epoxy groups in their molecule. Epoxy compounds having epoxy equivalents of 60–6000 are preferable, and epoxy compounds having epoxy equivalents of 160–4000 are most preferable. The reason is that final products obtained from a curable resin composition containing such epoxy compound have excellent adhesion.

The epoxy compounds employed in the present invention include glycidyl ether type epoxy resins, glycidyl ester type epoxy resins, glycidyl amine type epoxy resins, linear aliphatic epoxide type epoxy resin and alicyclic epoxide type epoxy resins. Examples of glycidyl ether type epoxy resins include bisphenol A type epoxy resin, polyhalogenated bisphenol A type epoxy resin, phenolic novolak type epoxy resin obtained by glycidyl-etherifying a condensate of phenol or cresol of formaldehyde and cresylic novolak type epoxy resin. Glycidyl ether type epoxy resins are preferable because they are commercially available. Mixtures of the above epoxy resin and a monoepoxy compound, such as phenyl glycidyl ether or butyl glycidyl ether may be used as an epoxy compound.

When an monoepoxy compound is used with an epoxy resin, heat resistance of the resulting cured product somewhat decreases. However, viscosity of a curable resin composition containing a monoepoxy compound decrease, so its workability is improved.

The curable resin composition of the present invention includes a mixture of components (a), (b) and (c), a preliminary reaction product of components (a), (b) and (c), the combination of said mixture and said preliminary reaction product, the combination of (a) and the preliminary reaction product of (b) and (c).

The curable resin compositions can be prepared by either wet process or dry process. Choice of the process is determined by the proportion of components and final use of the composition.

In the wet process, each component is dissolved in a solvent separately, and the components while in the solvent are blended so as to obtain a curable resin composition having the desired proportion. Alternatively, all these components may be dissolved in one solvent to form a curable resin composition having the desired proportion.

The compositions prepared according to the wet process contain the solvent or solvents. The solvent may be removed by heating the composition or by keeping the composition under a reduced pressure. Compositions containing no solvent in which these components are uniformly blended may be prepared from the composition containing solvent by means of the precipitation method.

Solvents suitable for polyphenylene resin include, for example, aromatic hydrocarbons, such as benzene, toluene and the like; and halogenated hydrocarbons, such as chloroform.

Solvents suitable for the polyfunctional maleimide compounds include, for example, non-protonic polar solvents, such as N-methyl pyrrolidone, N,N-dimethyl formamide, or dimethyl sulfoxide; and ketones, such as acetone and the like.

Solvents suitable for the polyfunctional cyanate ester compounds and the epoxy compounds include, for example, aromatic hydrocarbons, such as toluene, xylene and the like; ketones, such as acetone and the like; esters, such as ethyl acetate and the like; and ethers, such as dibutyl ether and the like.

When a curable resin composition contains polyphenylene ether resin and a polyfunctional maleimide compound in amount of less than 10 wt%, the composition is dissolved in chloroform to form a uniform solution. When the curable resin composition containing polyphenylene ether resin and a polyfunctional maleimide compound in amount of more than 10 wt% is added to chloroform, not all the maleimide compound is dissolved in the solvent, whereby a dispersion is formed. Preliminary reaction products of a polyfunctional maleimide compound and a polyfunctional cyanate ester compound and those of a polyfunctional maleimide compound, a polyfunctional cyanate ester and an epoxy compound are dissolved more easily in an aromatic hydrocarbon, such as toluene, xylene or benzene than when these monomers are dissolved individually in such solvent. Therefore a curable resin composition containing preliminary reactions of these components has excellent workability.

According to the dry process, a mixture of these components having proportions determined by the end use is milled uniformly to obtain a uniform blend.

The preliminary reaction may be carried out in the presence or absence of a catalyst and in the presence or absence of a solvent by heating the components, but to such an extent that gelation does not occur. The catalysts for the preliminary reaction are the ones employed in preparation of prepolymers of a polyfunctional maleimide compound or of a polyfunctional cyanate ester compound.

The proportion of components in a curable resin composition of the present invention is not critical. However, the composition may contain component (a) in amount of 2–99 wt%, component (b) in amount of 0.9–97.9 wt% and component (c) in amount of 0.1–94% by weight based on the total weight of the component (a), the component (b) and the component (c). The proportion is mainly determined by the use of the composition.

The method of curing the resin composition of this invention is not restricted in particular. Usually, it is performed by heating. Generally, a temperature of about 50° to about 400° C., preferably a temperature of about 100° to about 330° C., is selected. The time required for curing differs depending upon the form in which the resin composition of this invention is used, i.e. depending upon whether it is a thin film, or a relatively thick molded article or laminate. Usually, a period sufficient for curing of the resin composition may be selected from the range of 30 seconds to 10 hours. When the resin composition of this invention is to be used molded articles, laminates or bonded structures, it is desirable to apply pressure during the heat curing mentioned above.

A curable resin composition of the present invention may contain a catalyst or catalysts for the purpose of accelerating reticulation. Examples of the catalysts include organic acid metal salts such as lead naphthenate, lead searate, zinc octoate, zinc naphthenate, tin oleate, dibutyltin maleate, manganese naphthenate, cobalt naphthenate and a lead salt of resin acid; metal chlorides such as $SnCl_4$, $ZnCl_2$ and $AlCl_3$; and organic bases such as triethylenediamine. The amount of the catalyst employed depends largely on the type of the catalyst, the curing conditions, or the use of the final cured product. Usually, it is not more than 5% by weight based on the total resin solid.

Other curing methods involve use of ionizing radiation, electron beams from various types of accelerators, gamma-rays from isotopes such as cobalt 60; sun-light; and active energy, for example, light radiated from a light source such as a tungsten lamp, or a low-pressure or high-pressure mercury lamp. In the case of photocuring, the resin composition of this invention may contain up to 5% by weight, based on the resin solid, of a known photosensitizer, for example, an organic carbonyl compound such as benzoin, benzoin methyl ether, benzathrone, anthraquinone and benzophenone, or a combination of a sensitizing dye such as eosine, erythrosine or acridine with an amine. Such a photocurable resin composition containing a photosensitizer is effective in coating applications.

Natural, semi-synthetic or synthetic resins may be incorporated in a curable resin composition of this invention in order to improve chemical or physical properties of coating, laminate or molding obtained from the composition. Examples of such resins are oleoresin such as drying oils and non-drying oils, rosin, shellac, copal, oil-modified rosin, phenolic resin, alkyd resin, urea resin, melamine resin, polyester resin, vinyl butyral resin, vinyl acetate resin, vinyl chloride resins, acrylic resins, silicone resin and rubbers. They are used singly or as a mixture of two or more. These resins may be used in such an amount that they do not impair the inherent properties of the composition.

Reinforcing materials or fillers in fibrous or powdery form may be incorporated in a curable resin composition of this invention. Examples of the powdery reinforcing materials or fillers are carbon black, finely divided silica, fired clay, basic magnesium silicate, powdery diatomaceous earth, alumina, calcium carbonate, magnesium carbonate, magnesium oxide, kaolin, sericite and boron nitride.

Examples of the fibrous reinforcing material include inorganic fibers such as ceramic fibers, asbestos, rockwool, glass fibers, slag wool and carbon fibers, natural and synthetic fibers such as paper, pulp, wood flour, cotton, linter and polyimide fibers. The fibrous reinforcing materials may be used in the form of chopped fibers, staples, tows, webs, woven fabrics, non-woven fabrics or sheets. The amount of the reinforcing material or the filler varies depending upon the use of the final product. When it is used as a laminating material or molding material, the reinforcing material or the filler may be used in an amount of up to 400 parts by weight per 100 parts by weight of the resin solid. For flame retarding purposes, the resin composition of this invention may also comprises flame retardants known for polyphenylene ether resins, for example, phosphate esters, halogenated organic compounds and combinations of halogen-containing compounds and antimony compounds.

For coloring purposes, a curable resin composition of this invention may include white pigments such as titanium dioxide, and coloring pigments or various organic dyes and pigments, such as lead yellow, carbon black, iron black, molybdenum red, prussian blue, navy blue, cadmium yellow and cadmium red.

When a curable resin composition of this invention is to be used in paint applications, it may contain known paint additives, for example, rust-proofing pigments such as zinc chromate, red lead, red iron oxide, zinc, and strontium chromate; antisagging agents such as aluminum stearate; dispersants; thickeners; film modifying agents; extender pigments; and fire retardants.

The resin composition of this invention can be applied to various uses as mentioned hereinabove. Accordingly, various processing methods can be applied according to the uses. For example, in addition to forming the resin composition into a molded article, the resin composition may be formulated into a paint or an adhesive, which may be coated on a substrate. Or the resin composition may be impregnated into a powdery substrate to form a molding material which is then subjected to shell molding. Or the composition may be impregnated in a fibrous reinforcing material to form a molding material which is then laminated.

The curable resin composition of the present invention can be processed by various methods. For example, the composition can be applied to a substrate as a film or an adhesive layer. A powdery substrate is impregnated with the composition. The composition-impregnated substrate can be molded by shell mold. A reinforcing fiber is impregnated with the composition. A laminate can be prepared for the composition-impregnated fiber.

The present invention is further illustrated by the following non-limiting Examples and comparative runs.

All percents and parts in these Example and comparative run are by weight, unless otherwise specified.

EXAMPLES 1–3 AND COMPARATIVE RUN 1–3

Polyphenylene ether copolymer (a random copolymer derived from 95 mol% of 2,6-dimethylphenol and 5 mol% of 2,3,6-trimethylphenol on monomer basis) having an intrinsic viscosity, measured at 25° C. in chloroform, of 0.34 dl/g, bis(4-maleimidophenyl)methane and epoxy resin (ECN-1273 produced by Ciba Geigy AG) were added to a Henschel mixer in proportions as shown in Table 1 and were uniformly mixed therein. The resulting compositions were placed between two copper foils, the gap of the foils being in the range of 1.5–1.6 mm and were compression-molded at 230°–240° C. and 100 Kg/cm$^2$ for 1 hour to obtain two side samples. A variety of tests as shown in Table 1 were carried out by using these samples. The results are shown in Table 1.

For comparison, the above procedures were repeated except that each of polyphenylene ether resin, mixture of polyphenylene ether resin and epoxy resin and mixture of bis(4-maleimidophenyl)methane and epoxy resin were used in place of the above composition. The results are shown in Table 1.

EXAMPLE 4

30 Parts of poly(2,6-dimethyl-1,4-phenylene)ether having an intrinsic viscosity, measured at 25° C. in chloroform, of 0.30 dl/g, 60 parts of poly(phenyl methylene)polymaleimide (having three N-phenyl maleimide groups on average in its molecule) obtained by reacting maleic anhydride with poly(phenylmethylene)polyamine obtained by reacting aniline and formaldehyde and 10 parts of epoxy resin (ECN-1273 produced by Ciba Geigy AG) were uniformly mixed in a Henschel mixer. The resulting composition was placed between two copper foils, the gap of the foils being of which was in the range of 1.5–1.6 mm and was compression-molded at 240° C. and 100 Kg/cm$^2$ for 1 hour to obtain a two side copper clad sample. A variety of tests as shown in Table 1 were carried out on the sample. The results are shown in Table 1.

EXAMPLES 5–7 AND COMPARATIVE RUN 4–5

Polyphenylene ether copolymer employed in Examples 1–3, prepolymer of cyanate ester obtained by heating 2,2-bis(4-cyanatophenyl)propane with stirring at 150° C. for 3 hours, and epoxy resin (ECN-1273 produced by Ciba Geigy AG) were added to Henschel mixer in proportions as shown in Table 1 and were uniformly mixed therein. The resulting compositions were placed between two copper foils, the gap of the foils being in the range of 1.5–1.6 mm and were compression-molded at 230°–240° C. and 100 Kg/cm² for 1 hour to obtain two side copper clad samples. A variety of tests as shown in Table 1 were carried out on these samples. The results are shown in Table 1.

For comparison, the above procedures were repeated except that each of mixture polyphenylene ether resin and epoxy resin and mixture of the prepolymer of cyanate ester and epoxy resin was used in place of the above composition. The results are shown in Table 1.

EXAMPLE 8

31 Parts of poly(phenylmethylene)polymaleimide (having three N-phenylmaleimide groups on average in its molecule) obtained by reacting maleic anhydride with poly(phenylmethylene)polyamine obtained by reacting aniline with formaldehyde, 54 parts of 2,2-bis(4-cyanatophenyl)propane and 15 parts of epoxy resin (Epikote 828 produced by Shell Chemical Co., Ltd.) were placed in beaker, and reaction of these components was carried out with stirring at 100° C. for 2 hours to obtain prepolymer containing maleimide, cyanate ester and epoxy compound.

50 Parts of the prepolymer and 50 parts of polyphenylene ether resin of Examples 1–3 were added to Henschel mixer and was uniformly mixed therein. The resulting composition was placed between two copper foils, the gap of the foils being in the range of 1.5–1.6 mm and were compression-molded at 235° C. and 100 Kg/cm² for 1 hour to obtain a two side copper clad sample. A variety of tests as shown in Table 1 were carried out by using the sample. The result are shown in Table 1.

EXAMPLE 9

9.8 Parts of bis(4-maleimidophenyl)methane, 87.8 parts of 2,2-bis(4-cyanatophenyl)propane and 2.4 parts of epoxy resin (Epikote 152 produced by Shell Chemical Co., Ltd.) reacted preliminarily with stirring at 130° C. for 4 hours to obtain prepolymer. 90 Parts of the prepolymer and 10 parts of polyphenylene ether copolymer of Examples 1–3 were dissolved in toluene to form a resin solution having a resin content of 30%. A glass cloth was impregnated with the solution and dried at 110° C. for 5 minutes and then at 140° C. for additional 15 minutes to obtain prepreg.

The ratio of polyphenylene ether resin:maleimide:cyanate ester:epoxy compound in the prepreg was 10:9:79:2 by weight.

Four layers of the prepregs were sandwiched between two copper foils, and pressed at 100 Kg/cm² and 140° C. for 0.5 hours, at 100 Kg/cm² and 150° C. for 0.5 hours and then at 100 Kg/cm² and 180° C. for 1 hour and then cured at 240° C. for 4 hours to produce a two side copper-clad laminate. The performance of the laminate are set forth in Table 2.

EXAMPLE 10

62 Parts of polyphenylene ether copolymer of Examples 1–3 and 38 parts of prepolymer of Example 9 were dissolved in toluene to form a resin solution having a resin content of 20%. A glass cloth was impregnated with the solution and dried at 110° C. for 5 minutes and then at 140° C. for additional 15 minutes to obtain prepreg.

The ratio of polyphenylene ether resin:maleimide:cyanate ester:epoxy compound in the prepreg was 62:4:33:1 by weight.

Four layers of the prepregs were sandwiched between two copper foils, and pressed at 100 Kg/cm² and 210° C. for 2 hours and then cured at 100 Kg/cm² and 240° C. for 4 hours to produce a two side copper-clad laminate 4 mm shick. The performances of the laminate are set forth in Table 2.

EXAMPLE 11

20 Parts of poly(2,6-dimethyl-1,4-phenylene)ether having an intrinsic viscosity, measured at 25° C. in chloroform, of 0.45 dl/g, 20 parts of bis(4-maleimidophenyl)methane of Examples 1–3, 30 parts of prepolymer of cyanate ester of Examples 5–7 and 30 parts of brominated phenol novolak type epoxy resin having epoxy equivalent of 285 and bromine content of 36%) dissolved in toluene to form a resin solution having a resin content of 30%. A glass cloth was impregnated with the solution and dried at 110° C. for 5 minutes and then at 120° C. for additional 15 minutes to obtain prepreg.

Eight layers of the prepregs were sandwiched between two copper foils, and pressed at 100 Kg/cm² and 200° C. for 2 hours to produce a copper-clad laminate 1.6 mm thick.

12.7×100 Mm test sample was obtained by cutting the laminate. Vertical flame test for the test sample was carried out. The sample exhibited flame retardancy of 94V-I in accordance with UL standard.

Other test results are shown in Table 2.

TABLE 1

| Example and comparative run | Components constituting curable resin composition component(a) | component(b) (1)* | component(b) (2)** | component(c) | Molding temperature (°C.) | Extraction residue by chloroform (%) | Glass transition temperature (°C.) | Copper foil peel strength (Kg/cm) | Dielectric constant (1 MHz) | Dielectric dissipation factor (1 MHz) |
|---|---|---|---|---|---|---|---|---|---|---|
| Example 1 | 90 | 5 | — | 5 | 240 | 36 | 229 | 1.3 | 2.4 | 0.0019 |
| 2 | 50 | 45 | — | 5 | 235 | 98 | 232 | 1.2 | 2.3 | 0.0040 |
| 3 | 15 | 80 | — | 5 | 230 | 100 | 245 | 0.9 | 2.4 | 0.0063 |
| Comp. run 1 | 100 | — | — | — | 250 | 0 | 210 | 1.1 | 2.4 | 0.0009 |
| 2 | 95 | — | — | 5 | 240 | 5 | 215 | 1.2 | 2.5 | 0.0015 |
| 3 | — | 95 | — | 5 | 230 | 100 | the resulting products were brittle, so measurements were impossible | | | |
| Example 4 | 30 | 60 | — | 10 | — | 97 | 225 | 1.0 | 2.4 | 0.0027 |
| 5 | 95 | — | 4 | 1 | 240 | — | 225 | 1.8 | 2.4 | 0.0012 |
| 6 | 50 | — | 49 | 1 | 235 | — | 231 | 1.8 | 2.1 | 0.0028 |
| 7 | 4 | — | 95 | 1 | 230 | — | 297 | 1.9 | 2.5 | 0.0057 |
| Comp. run 4 | 99 | — | — | 1 | 240 | — | 211 | 1.1 | 2.2 | 0.0006 |
| 5 | — | — | 99 | 1 | 230 | — | 300 | 1.9 | 2.8 | 0.0078 |

TABLE 1-continued

| Example and comparative run | Components constituting curable resin composition | | | | Molding temperature (°C.) | Extraction residue by chloroform (%) | Glass transition temperature (°C.) | Copper foil peel strength (Kg/cm) | Dielectric constant (1 MHz) | Dielectric dissipation factor (1 MHz) |
|---|---|---|---|---|---|---|---|---|---|---|
| | component(a) | component(b) (1)* | (2)** | component(c) | | | | | | |
| Example 8 | 50 | 15.5 | 27 | 7.5 | — | 99 | 224 | 1.8 | 2.5 | 0.0044 |

Note:
*polyfunctional maleimide
**polyfunctional cyanate ester

TABLE 2

| Example No. | Components constituting curable resin composition | | | | Peeling strength of copper foil (Kg/cm) | | Glass transition temperature (°C.) | Hot solder resistance at 260° C. (sec) | Dielectric constant (1 MHz) | Dielectric dissipation factor (1 MHz) | Shock test after boiling for 8 hours (floating in solder at 260° C.) (sec) |
|---|---|---|---|---|---|---|---|---|---|---|---|
| | component(a) | component(b) (1)* | (2)** | component(c) | in normal state | after solder treatment at 260° C. for 20 seconds | | | | | |
| 9 | 10 | 9 | 79 | 2 | 1.8 | 1.8 | 304 | >600 | 3.4 | 0.0063 | — |
| 10 | 62 | 4 | 33 | 1 | 2.2 | 2.2 | 236 | >600 | 3.0 | 0.0021 | >30 |
| 11 | 20 | 20 | 30 | 30 | 1.6 | — | — | >600 | 3.8 | 0.0034 | >30 |

Note:
*polyfunctional maleimide
**polyfunctional cyanate ester

The respective factors of the test samples were evaluated by the following methods:
(1) Chloroform extraction residue: The copper foil was pealed off each sample which was, cut into squares having a length of about 3 mm on one side, and extracted with chloroform by a Soxhlet's extractor for continuous 18 hours. The weight percent of the unextracted residue on the basis of the sample before the extraction was measured.
(B') Glass transition point: The copper foil was peeled off each sample, and test bars having a width of 0.7 to 1.2 mm and a length of about 70 mm were cut out of the sample, and the glass transition point of each test bar was measured with a torsion free damping viscoelastometer [Type of RD-1100A, Rhesca Co., Ltd.]
(3) Peel strength: Two parallel cuts 10 mm apart were made in the surface of the copper foil and the stress developing when the copper foil was peeled at an angle of 90° was measured with a tensile testing instrument (TENSION, Toyo Baldwin Co., Ltd.)
(4) Dielectric constant and dielectric dissipation factor: The copper foil was peeled off each sample which was cut into squares having a length of 50 mm on one side. The two factors were measured with a dielectric loss meter at 1 MHz.
(5) Resistance to hot solder: Each sample was cut into squares having a length of 25 mm on one side, and they were put on a solder bath (260° C.) with the copper foil facing down (only one copper foil was removed from the samples both sides of which were clad with a copper foil).
The time for any blister or peeling to develop was measured.

What is claimed is:
1. A curable resin composition, comprising:
(a) a polyphenylene ether resin;
(b) a component selected from the group consisting of:
  a polyfunctional cyanate ester compound having at least two cyanate groups; and
  a mixture of a polyfunctional cyanate ester compound and a polyfunctional maleimide compound;

wherein said polyfunctional cyanate ester compound is selected from the group consisting of:
(1) a polyfunctional cyanate ester monomer having at least two cyanate groups,
(2) a prepolymer of (1),
(3) a coprepolymer of (1) and an amine,
(4) a coprepolymer of (1) and a polyfunctional maleimide, and
(5) mixtures thereof;
and
said polyfunctional maleimide compound is selected from the group consisting of:
(i) a polyfunctional maleimide,
(ii) a prepolymer of a polyfunctional maleimide,
(iii) a coprepolymer of a polyfunctional maleimide and an amine, and
(iv) mixtures thereof;
and
(c) an epoxy compound;
said composition including a mixture of components (a), (b) and (c), a preliminary reaction product of components (a), (b) and (c), the combination of said mixture and said preliminary reaction product, and the combination of (a) and the preliminary reaction product of (b) and (c); wherein the amount of (a) is in the range of 4–95 wt% and the amount of (b)+(c) is in the range of 96–5 wt% on the basis of the total amount of (a), (b) and (c).
2. The composition according to claim 1 wherein the polyphenylene ether resin is a polymer having in the polymer chain skeleton a recurring unit of the formula

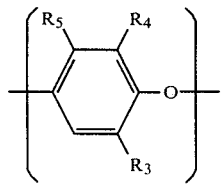

wherein $R_3$ and $R_4$ are identical or different and represent an alkyl group having 1 to 3 carbon atoms, and $R_5$ represents a hydrogen atom or an alkyl group having 1 to 3 carbon atoms.

3. The composition according to claim 2 wherein the alkyl group represented by $R_3$, $R_4$ and $R_5$ is a methyl group.

4. The composition according to claim 2 wherein the polyphenylene ether resin is poly(2,6-dimethyl-1,4-phenylene)ether, or a copolyphenylene ether derived from 2,6-dimethylphenol and 2,3,6-trimethylphenol.

5. The composition according to claim 2 wherein the polyphenylene ether resin has a number average molecular weight of about 1000 to about 30000.

6. The composition according to claim 1 wherein the component (b) is (4) or (5).

7. The composition according to claim 6 wherein the maleimide is represented by the formula

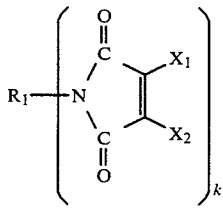

wherein $R_1$ represents an aromatic or aliphatic organic group having a valence of k, $X_1$ and $X_2$ are the same or different and are independently hydrogen, halogen or lower alkyl group and k is integer of at least 2.

8. The composition according to claim 1 wherein the cyanate ester is represented by the formula $$R_2-O-C\equiv N)_l$$

wherein l is an integer of at least 2, and $R_2$ represents an aromatic organic group having a valence of l, provided that the groups $-O-C\equiv N)_l$ are directly bonded to the aromatic ring of the organic group.

9. The composition according to claim 6 wherein the polyfunctional maleimide is selected from the group consisting of 1,3- or 1,4-dimaleimido benzene, 1,3- or 1,4-bis-(maleimido methylene)benzene, 1,3- or 1,4-dimaleimide cyclohexane, 1,3- or 1,4-bis(maleimidomethylene)cyclohexane 4,4'-dimaleimido biphenyl, bis(4-maleimidophenyl)methane, bis(4-maleimidophenyl)ether, bis(4-maleimidophenyl)sulfone, bis(4-maleimido-3-methylphenyl)methane, bis(4-maleimido-3-chlorophenyl)methane, bis(4-maleimido-3,5-dimethylphenyl)methane, 2,2-bis(4-maleimido-3-methylphenyl)propane, 2,2-bis(4-maleimido-3,5-dibromophenyl)propane, bis(4-maleimidophenyl)phenylmethane, 3,4-dimaleimidophenyl-4'-maleimidophenylmethane, 1,1-bis(4-maleimidophenyl)-1-phenylmethane, and maleimides derived from melamine and addition product of formalin and an aniline in which two or more aniline benzene rings bond through methylene group.

10. The composition according to claim 7 wherein the polyfunctional cyanate ester 1,3- or 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane; 2,2-bis(4-cyanatophenyl)propane, 2,2-bis(3,5-dichloro-4-cyanatophenyl)propane, 2,2-bis(3,5-diblomo-4-cyanatophenyl)propane; bis(4-cyanatophenyl)ether; bis(4-cyanatophenyl)thioether; bis(4-cyanatophenyl)sulfone; tris(4-cyanatophenyl)phosphite; tris(4-cyanatophenyl)phosphate; bis(4-chloro-4-cyanatophenyl)methane; cyanated novolak derived from novolak cyanated bisphenol type polycarbonate oligomer derived from bisphenol type polycarbonate oligomer and mixture thereof.

11. A curable resin composition according to claim 1, wherein said polyfunctional cyanate ester monomer is a polyfunctional aromatic cyanate ester monomer having the formula $R(O-C\equiv N)_m$ wherein m is 2 to 10 and R is an aromatic group, the cyanate groups being bonded to an aromatic ring of said aromatic group.

* * * * *